United States Patent
Sato (10) Patent No.: US 7,279,904 B2
(45) Date of Patent: Oct. 9, 2007

(54) INPUT DEVICE

(75) Inventor: Kunio Sato, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/424,503

(22) Filed: Jun. 15, 2006

(65) Prior Publication Data

US 2007/0001681 A1    Jan. 4, 2007

(30) Foreign Application Priority Data

Jun. 29, 2005    (JP) .............................. 2005-190032

(51) Int. Cl.
*G01R 29/12* (2006.01)
*G01R 27/26* (2006.01)
*G01F 3/045* (2006.01)

(52) U.S. Cl. ...................... 324/457; 324/688; 345/174

(58) Field of Classification Search ................ 324/457, 324/458, 658, 661, 662, 676–680, 686–688, 324/690; 345/173, 174
See application file for complete search history.

(56) References Cited

U.S. PATENT DOCUMENTS

| | | | |
|---|---|---|---|
| 5,574,262 A * | 11/1996 | Petty ........................... | 345/173 |
| 6,559,658 B1 * | 5/2003 | Brandt ......................... | 324/681 |
| 2004/0130527 A1 * | 7/2004 | Endo et al. .................. | 345/156 |
| 2005/0001633 A1 * | 1/2005 | Okushima et al. .......... | 324/658 |
| 2006/0267953 A1 * | 11/2006 | Peterson et al. ............. | 345/173 |
| 2006/0279548 A1 * | 12/2006 | Geaghan ...................... | 345/173 |

FOREIGN PATENT DOCUMENTS

JP        2004-201175        7/2004

\* cited by examiner

*Primary Examiner*—Walter Benson
*Assistant Examiner*—Timothy J Dole
(74) *Attorney, Agent, or Firm*—Brinks Hofer Gilson & Lione (57) ABSTRACT

An input device is provided. The input device includes an input electrostatic sensor having an input electrode. A noise detection electrostatic sensor has a noise detection electrode disposed on a periphery of the input electrostatic sensor. A control unit is operable to receive an output signal from the input electrostatic sensor and a noise output signal from the noise detection electrostatic sensor and is operable to compare the output signal with the noise output signal to detect a noise component. The control unit is operable to discriminate the output signal and the noise output signal and is operable to control an input operation based on the output signal.

15 Claims, 11 Drawing Sheets

POSITIONAL RELATIONSHIP BETWEEN INPUT ELECTROSTATIC SENSOR AND HUMAN BODY

FIG. 6B

LOW FREQUENCY CLOCK SIGNAL

FIG. 6C

INPUT DELAY SIGNAL

FIG. 6D

OUTPUT SIGNAL OF LOGICAL PRODUCT MEANS

FIG. 6E

SMOOTHED OUTPUT SIGNAL

FIG. 7A
POSITIONAL RELATIONSHIP BETWEEN NOISE DETECTION ELECTROSTATIC SENSOR AND HUMAN BODY

FIG. 7B
HIGH FREQUENCY CLOCK SIGNAL

FIG. 7C
NOISE DETECTION DELAY SIGNAL

FIG. 7D
NOISE SIGNAL OF LOGICAL PRODUCT MEANS

FIG. 7E
SMOOTHED NOISE SIGNAL

FIG. 8A
POSITIONAL RELATIONSHIP BETWEEN ELECTROSTATIC SENSOR AND HUMAN BODY

FIG. 8B
POSITIONAL RELATIONSHIP BETWEEN NOISE DETECTION ELECTROSTATIC SENSOR AND HUMAN BODY

FIG. 8C
SMOOTHED OUTPUT SIGNAL

FIG. 8D
SMOOTHED OUTPUT SIGNAL

FIG. 9A
POSITIONAL RELATIONSHIP BETWEEN ELECTROSTATIC SENSOR AND HUMAN BODY

FIG. 9B
POSITIONAL RELATIONSHIP BETWEEN NOISE DETECTION ELECTROSTATIC SENSOR AND HUMAN BODY

FIG. 9C
SMOOTHED OUTPUT SIGNAL

FIG. 9D
SMOOTHED OUTPUT SIGNAL

FIG. 10 RELATED ART

FIG. 11A RELATED ART
POSITIONAL RELATIONSHIP BETWEEN ELECTROSTATIC SENSOR AND HUMAN BODY

FIG. 11B RELATED ART
CLOCK SIGNAL

FIG. 11C RELATED ART
DELAY SIGNAL

FIG. 11D RELATED ART
OUTPUT SIGNAL OF LOGICAL PRODUCT MEANS

FIG. 11E RELATED ART
SMOOTHED OUTPUT SIGNAL

FIG. 12A
RELATED ART
POSITIONAL RELATIONSHIP BETWEEN ELECTROSTATIC SENSOR AND HUMAN BODY

FIG. 12B
RELATED ART
CLOCK SIGNAL

FIG. 12C
RELATED ART
DELAY SIGNAL

FIG. 12D
RELATED ART
OUTPUT SIGNAL OF LOGICAL PRODUCT MEANS

FIG. 12E
RELATED ART
SMOOTHED OUTPUT SIGNAL

FIG. 13A RELATED ART
POSITIONAL RELATIONSHIP BETWEEN ELECTROSTATIC SENSOR AND HUMAN BODY

FIG. 13B RELATED ART
CLOCK SIGNAL

FIG. 13C RELATED ART
DELAY SIGNAL

FIG. 13D RELATED ART
OUTPUT SIGNAL OF LOGICAL PRODUCT MEANS

FIG. 13E RELATED ART
SMOOTHED OUTPUT SIGNAL

INPUT DEVICE

BACKGROUND

1. Field

An input device having an electrostatic sensor is provided. The input device includes an electrostatic sensor that outputs an electrical signal by approach or contact of a part of a human body, such as a hand or a finger.

2. Related Art

In general, an input device having an electrostatic sensor for detecting change in capacitance is widely used for various electronic apparatuses. For example, in electronic apparatuses that recently came into wide use, such as mobile telephones or personal digital assistants (PDA), an input means that inputs information, such as numeral or character, is employed.

An electrostatic sensor of an input device is generally provided at the backside of an input surface of an input key formed on an electronic apparatus. This electrostatic sensor includes a substrate having a flat electrode. When a hand or a finger of an operator of the electronic apparatus approaches or makes contact with the input surface of the input key facing the electrode, the capacitance of the electrode is changed and an output signal according to the change is transmitted to a control means of an input device, thereby performing an input operation of the input device.

Figure 10:
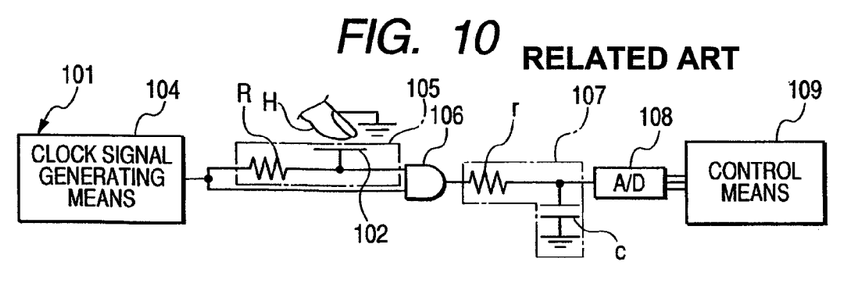
FIG. 10 is a block diagram showing a circuit of a conventional input device.
Figure 11A:
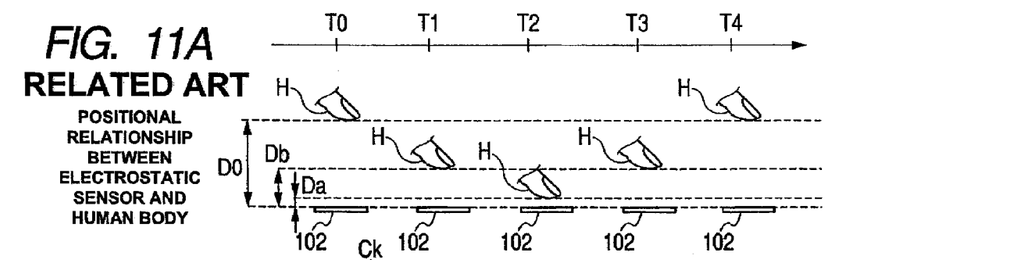
FIG. 11 is a graph showing a detection operation of a conventional noise detection electrostatic sensor from a left side to a right side in time series.
Figure 11B:
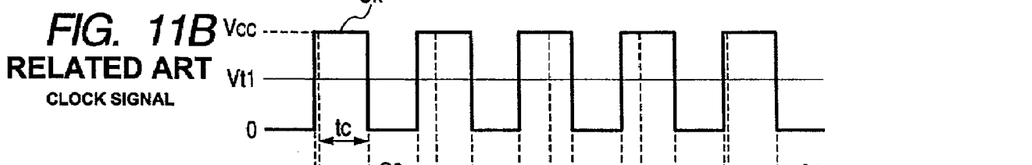
Figure 11C:
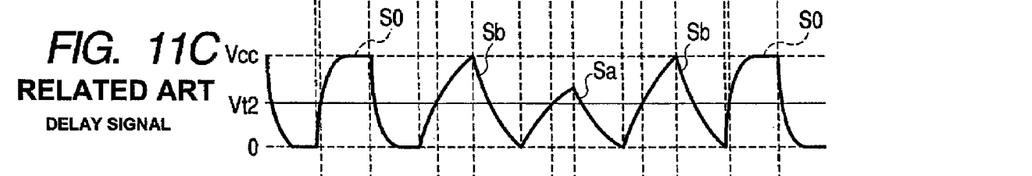
Figure 11D:
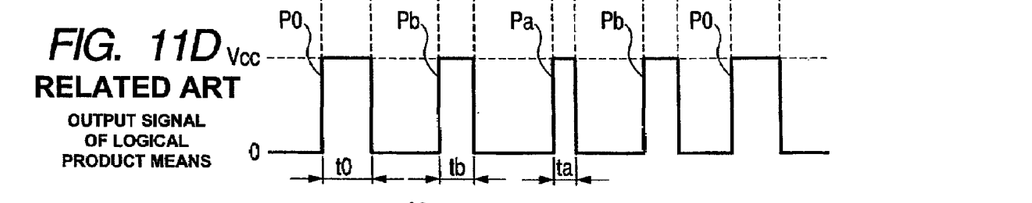
Figure 11E:
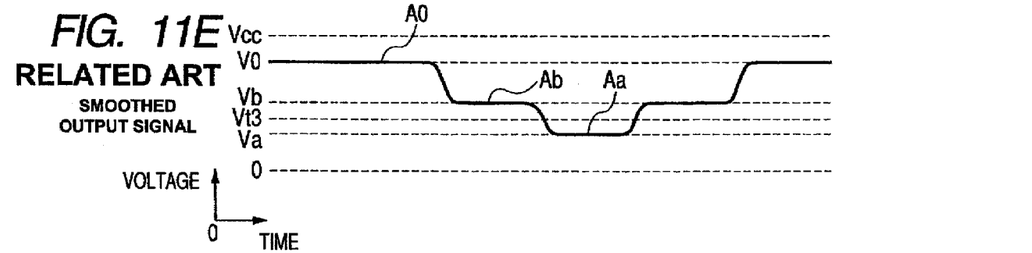
Figure 12A:
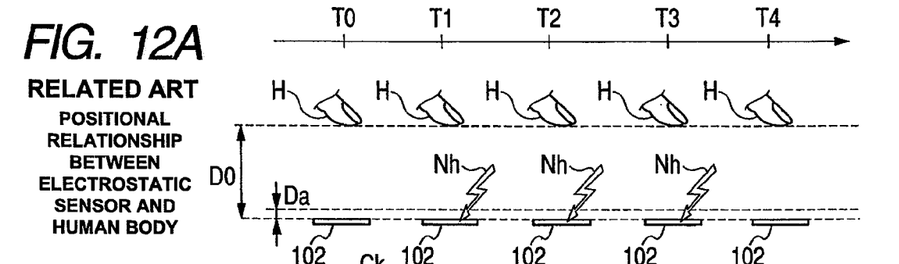
FIG. 12 is a graph showing a detection operation from a left side to a right side in time series when the conventional electrostatic sensor reacts with noise having a strong electric field.
Figure 12B:
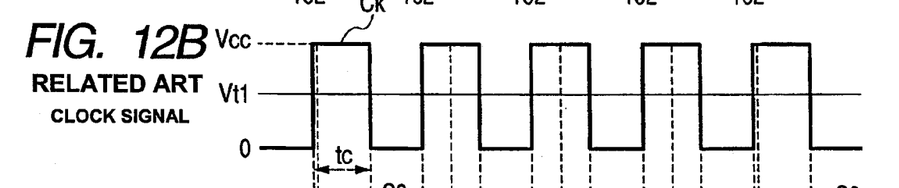
Figure 12C:
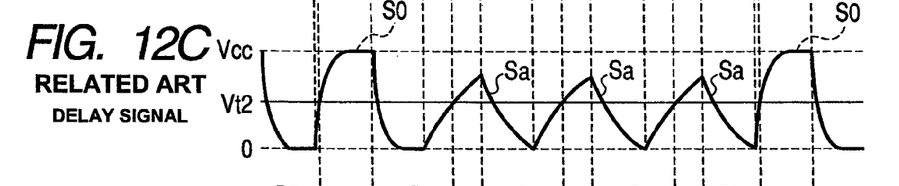
Figure 12D:
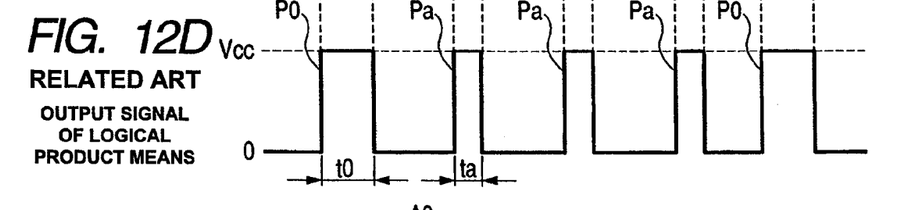
Figure 12E:
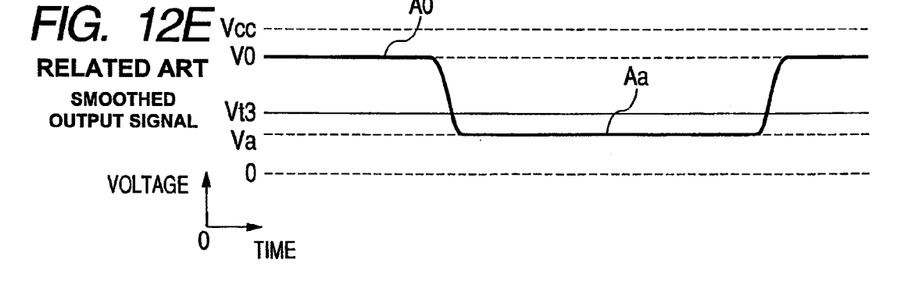
Figure 13A:
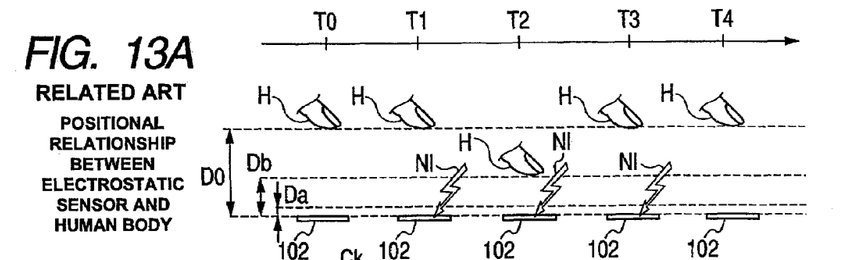
FIG. 13 is a graph showing a detection operation from a left side to a right side in time series when the conventional electrostatic sensor reacts with noise having a weak electric field.
Figure 13B:
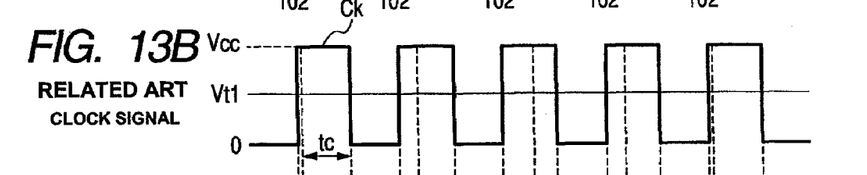
Figure 13C:
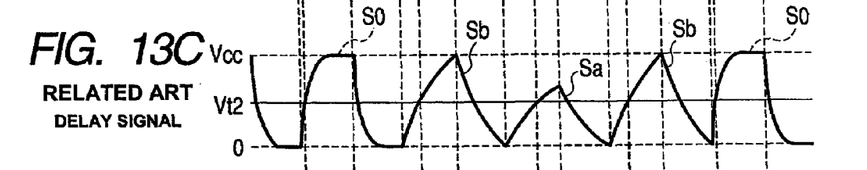
Figure 13D:
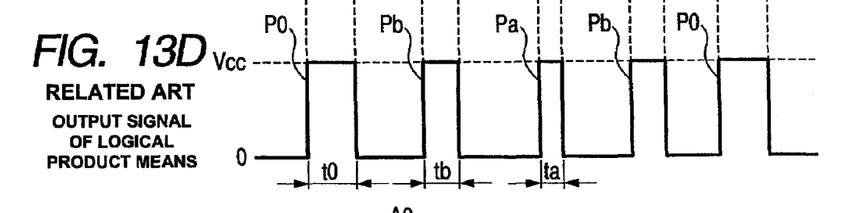
Figure 13E:
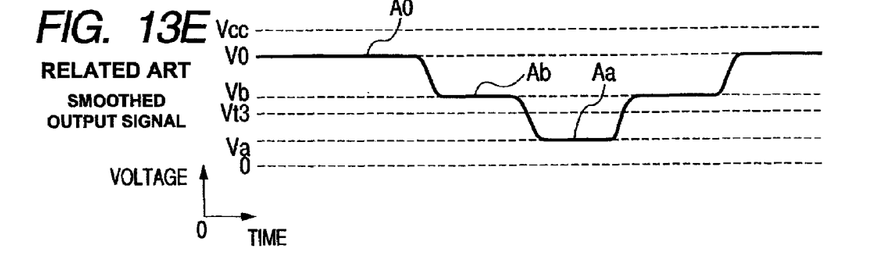

As shown in FIG. 10, a conventional input device 101 generally includes a clock signal generating means 104 for generating a clock signal Ck, a delay means 105 having the above-described electrostatic sensor 102, a logical product means 106 connected to the clock signal generating means 104 and the delay means 105, a smoothing means 107 for smoothing an output signal obtained from the logical product means 106, an A/D converter 108 for converting the smoothed output signal from analog to digital, and a control means 109 for controlling an input operation based on the digital output signal. The delay means 105 is a delay circuit including an electrode 102 and a resistor R formed on a dielectric substrate, the logical product means 106 is a general AND circuit, the smoothing means 107 is a smoothing circuit including a resistor R and a capacitor c, and the control means 109 is a control circuit including a central processing unit (CPU) or a memory (see Patent Document 1).

FIG. 11 shows a detection operation of the conventional input device 101 from a left side to a right side in time series. As shown in FIG. 11, when a finger H of a human body is sufficiently separated from the electrostatic sensor 102 (T0), a delay signal S0 having the same wavelength as that of the clock signal Ck is output from the delay means 105. Since a time for reaching a value higher than a threshold value Vt2 of the delay signal is long, a pulse width t0 of an output signal P0 of the logical product means 106 output based on the clock signal Ck and the delay signal S0 is substantially equal to the pulse width of the clock signal Ck, and an output signal A0 smoothed by the smoothing means 107 does not cause a voltage drop. To this end, although the output signal A0 passing through the smoothing means 107 and the A/D converter 108 is input to the control means 109, the control means 109 determines that the input operation is not performed (hereinafter, a distance, in which the finger H of the human body is sufficiently separated from the electrostatic sensor 102, is referred to as "non-reaction distance" and a time when the finger H of the human body approaches the electrostatic sensor 102 up to the non-reaction distance D0 is referred to as "non-reaction time").

Subsequently, when the finger H of the human body approaches the electrostatic sensor 102 closer than the non-reaction distance D0 (T1), the wavelength of the clock signal Ck is changed to a delay signal (RC delay signal) Sb of which the wavelength slowly rises and the delay signal Sb is output from the delay means 105. Since a time for reaching a value higher than the threshold value Vt2 of the delay signal is shorter than T0, a pulse width tb of an output signal Pb of the logical product means 106 output based on the clock signal Ck and the delay signal Sb becomes smaller than a pulse width tc of the clock signal Ck (tc>t0>tb). In addition, an output signal Ab smoothed by the smoothing means 107 causes a voltage drop from V0 to Vb such that the output signal does not fall below a threshold value Vt3. To this end, although an output signal Ab passing through the smoothing means 107 and the A/D converter 108 is input to the control means 109, the control means 109 determines that the input operation is not performed (hereinafter, a distance, in which the electrostatic sensor 102 reacts, is referred to as "reaction distance" and a time when the finger H of the human body approaches the electrostatic sensor 102 up to the reaction distance Db is referred to as "reaction time").

In addition, when the finger H of the human body approaches or makes contact with the electrostatic sensor 102 closer than the reaction distance Db (T2), the clock signal Ck is changed to a delay signal Sa of which the wavelength rises slower than that upon the reaction time T1 and the delay signal Sa is output from the delay means 105. In this case, since a time for reaching a value higher than the threshold value Vt2 of the delay signal is shorter than T1 upon the reaction time, a pulse width ta of an output signal Pa of the logical product means 106 output based on the clock signal Ck and the delay signal Sa significantly becomes smaller than a pulse width tc of the clock signal Ck (tc>t0>tb>ta). In addition, an output signal Ab smoothed by the smoothing means 107 causes a voltage drop from Vb to Va such that the output signal falls below the threshold value Vt3. To this end, when an output signal Aa passing through the smoothing means 107 and the A/D converter 108 is input to the control means 109, the control means 109 determines that the input operation is performed (hereinafter, a distance, in which the electrostatic sensor 102 reacts and the input operation was performed, is referred to as "input distance" and a time when the finger H of the human body approaches the electrostatic sensor 102 up to the input distance Da is referred to as "input time").

Furthermore, when the finger is separated from the input distance Da to the reaction distance Db (T3), the same delay signal Sb and output signal Pb as those upon the reaction time T1 are generated, and, when the finger is separated from the reaction distance Db to the non-reaction distance D0 (T4), the same delay signal S0 and output signal P0 as those upon the non-reaction time T0 are generated.

The conventional input device 101 determines whether the input operation of the input key having the electrostatic sensor 102 is performed, according to the change in capacitance generated when the finger H of the human body approaches or makes contact.

[Patent Document] Japanese Unexamined Patent Application Publication No. 2004-201175

However, when a noise source such as a high-frequency power supply is provided in the vicinity of the electrostatic sensor 102 or broadcasting wave is spread in the vicinity of the electrostatic sensor 102, that is, the electrostatic sensor 102 is provided in an environment which is apt to be influenced by the electric wave, although a portion of the human body approaches or makes contact with the electrostatic sensor 102, the capacitance of the electrostatic sensor 102 is changed and thus malfunction of the input device 101 may be caused.

For example, as shown in FIG. 12, when the capacitance of the electrostatic sensor 102 is changed by noise Nh spread in the vicinity of the electrostatic sensor 102 upon the non-reaction times T0 to T4 (T1 to T3), although the finger H of the human body does not approach or make contact with the electrostatic sensor 102, the same delay signal Sa as that upon the input time is transmitted to the logical product means 106. Thus, the logical product means 106 transmits the same output signal Pa as that upon the input time to the smoothing means 107. Accordingly, the conventional input device 101 may actually determine that the input operation was performed, although the finger H of the human does not approach or make contact with the electrostatic sensor 102. Thus, malfunction may be caused.

In addition, as shown in FIG. 13, when the capacitance of the electrostatic sensor 102 is changed by noise N spread in the vicinity of the electrostatic sensor 102 (T1 to T3), the same delay signal Sb as that upon the reaction time is transmitted to the logical product means 106. Thus, the logical product means 106 transmits the same output signal Pb as that upon the reaction time to the smoothing means 107. To this end, the smoothed output signal Ab drops from the voltage V0 to the voltage Vb. Accordingly, since the output signal Aa smoothed upon the reaction time, which is the same as that upon the input time, drops to the voltage Va lower than the threshold value Vt3 (T2), the conventional input device 101 may determine that the input operation is performed at the input distance Da, although the finger H of the human approaches or makes contact with the electrostatic sensor 102 up to only the reaction distance Db. Thus, malfunction may be caused due to change in sensitivity of the electrostatic sensor 102.

SUMMARY

Provided is an input device that determines an output signal according to approach or contact of a portion of a human body and an output signal that includes noise.

An input device that includes an input electrostatic sensor that detects whether a portion of a human body approaches or makes contact by change in capacitance. A noise detection electrostatic sensor is provided on the periphery of the input electrostatic sensor and detects the change in capacitance that is generated by a cause different from the approach or the contact of the portion of the human body A noise detection electrostatic sensor is provided on the periphery of the input electrostatic sensor and detects the change in capacitance that is generated by a cause different from the approach or the contact of the portion of the human body. A control compares an output signal obtained from the input electrostatic sensor with a noise signal obtained from the noise detection electrostatic sensor, determines the output signal obtained from the cause different from the approach or the contact of the potion of the human body to a noise component, and controls an input operation.

Accordingly, since the noise detection electrostatic sensor can separately detect only a cause (noise) different from the approach or the contact of the portion of the human body, it is possible to determine the output signal according to the approach or the contact of the portion of the human body to perform an input operation.

The noise detection electrostatic sensor may have a detection surface larger than that of the input electrostatic sensor.

Because a detection ability of the noise detection electrostatic sensor is physically improved, the noise detection electrostatic sensor can detect the small change in an electric field or a frequency band wider than the input electrostatic sensor.

The noise detection electrostatic sensor may have a protective cover that prevents the portion of the human body from approaching or making contact with the noise detection electrostatic sensor, and the protective cover may have a thickness by which the noise detection electrostatic sensor does not react when the portion of the human body contacts with the protective cover and a thickness by which the noise detection electrostatic sensor reacts as small as the control means cannot determine the noise component Accordingly, the noise detection electrostatic sensor can detect only the noise component.

In another embodiment, the input device may include a low frequency clock signal generator that generates a low frequency clock signal. An input delay means generates an input delay signal obtained by applying delay according to change in capacitance of the input electrostatic sensor to the low frequency clock signal. A high frequency signal generator generates a high frequency clock signal. A noise detection delay means generates a noise detection delay signal obtained by applying delay according to change in capacitance of the noise detection electrostatic sensor to the high frequency clock signal. A logical product means receives the low frequency clock signal, the input delay signal, the high frequency clock signal, and the noise detection delay signal and outputs the output signal or the noise signal. A smoothing means smoothes the output signal or the noise signal. An A/D convert or converts the output signal and the noise signal output from the smoothing means into a respective digital signal. The control means compares the output signal with the noise signal, both of which are converted into the respectively digital signals and determines the noise component Since the clock signal has a frequency higher than that of the clock signal input to the input electrostatic sensor is input to the noise detection electrostatic sensor, it is possible to improve a noise detection ability of the noise detection electrostatic sensor.

The control means may change a threshold value that determines whether the portion of the human body approaches or makes contact in correspondence with the noise component included in the output signal obtained by comparing the output signal with the noise signal.

It is possible to make the sensitivity of the input electrostatic sensor uniform, although the noise is continuously included in the output signal.

The control means may determine whether the output signal transmitted to the control means is obtained from a cause different from the approach or the contact of the portion of the human, depending on whether a predetermined time lapses after the output signal is received or a step number obtained from the output signal is a predetermined step number The control means can determine that the noise component is included in the output signal, although the noise having the same strong electric field as the approach or the contact of the portion of the human body is accidentally included in the output signal.

Since the noise detection electrostatic sensor, which is separately provided, physically and accurately detects only the noise component and the control means, which receives the noise signal, controls the input operation according to the noise component, it is possible to significantly reduce malfunction of the input device that is generated by the noise component.

DESCRIPTION

An input device will be described with reference to FIGS. 1 to 5.

Figure 1:
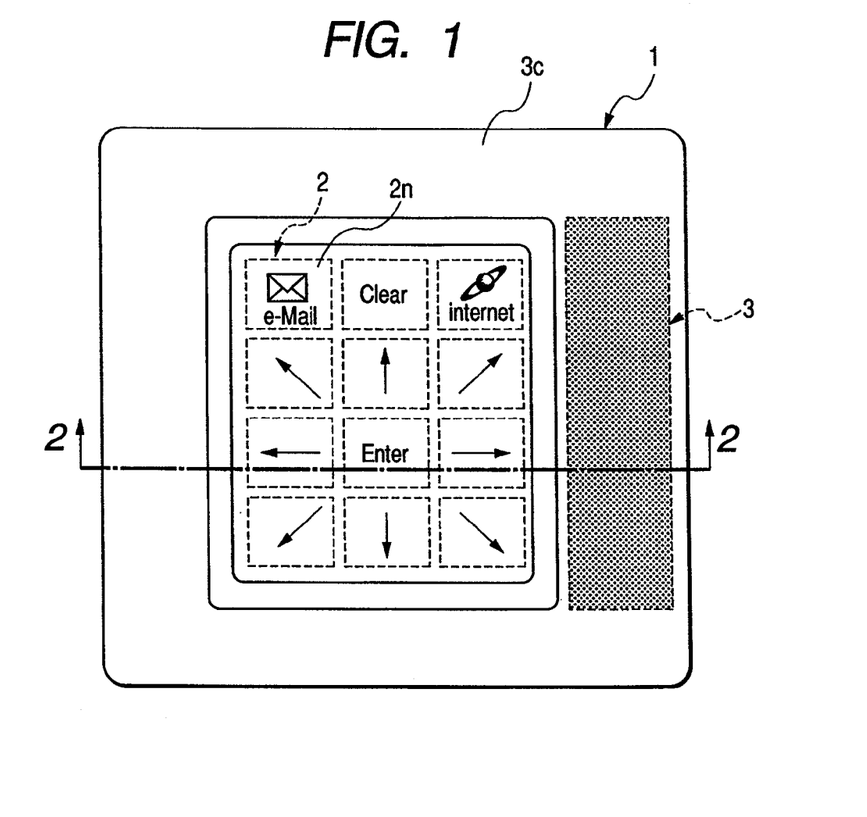
FIG. 1 is a plan view showing a positional relationship and a size relationship between an input electrostatic sensor and a noise detection electrostatic sensor of an input device.
Figure 2:
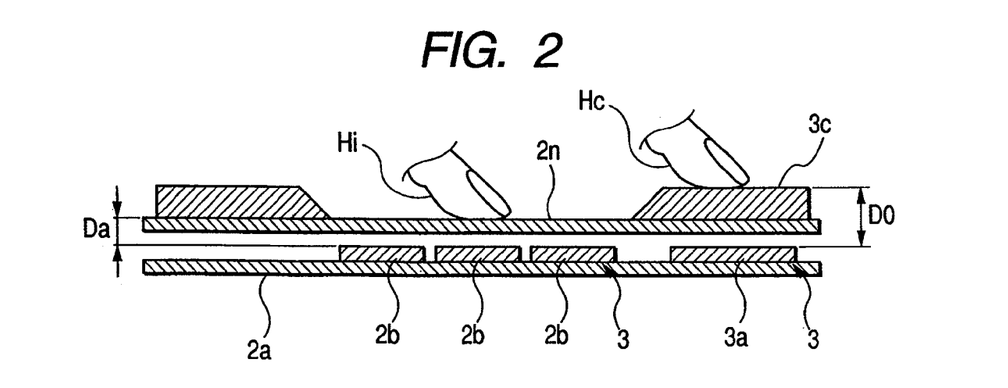
FIG. 2 is a cross-sectional view taken along line 2-2 of FIG. 1.
Figure 3:
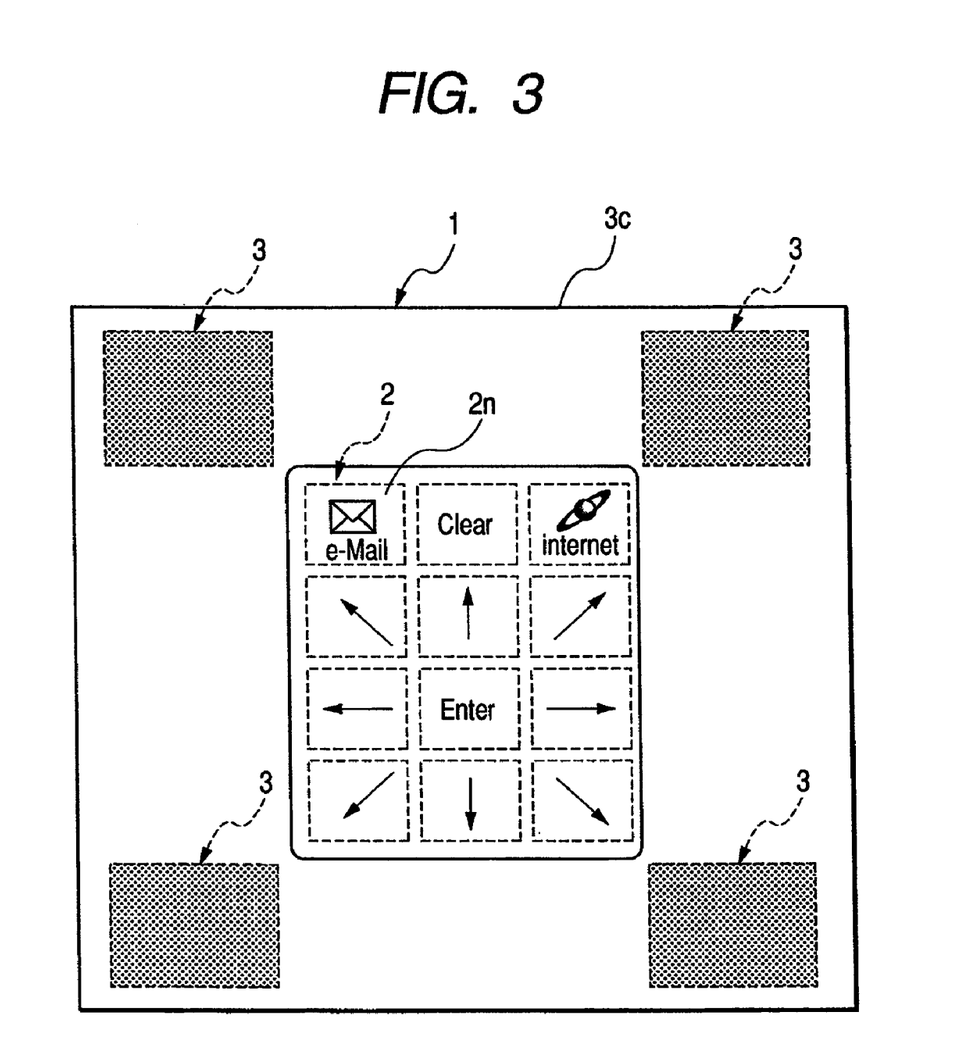
FIG. 3 is a plan view showing a noise detection electrostatic sensor according to another aspect of the present embodiment.
Figure 4:
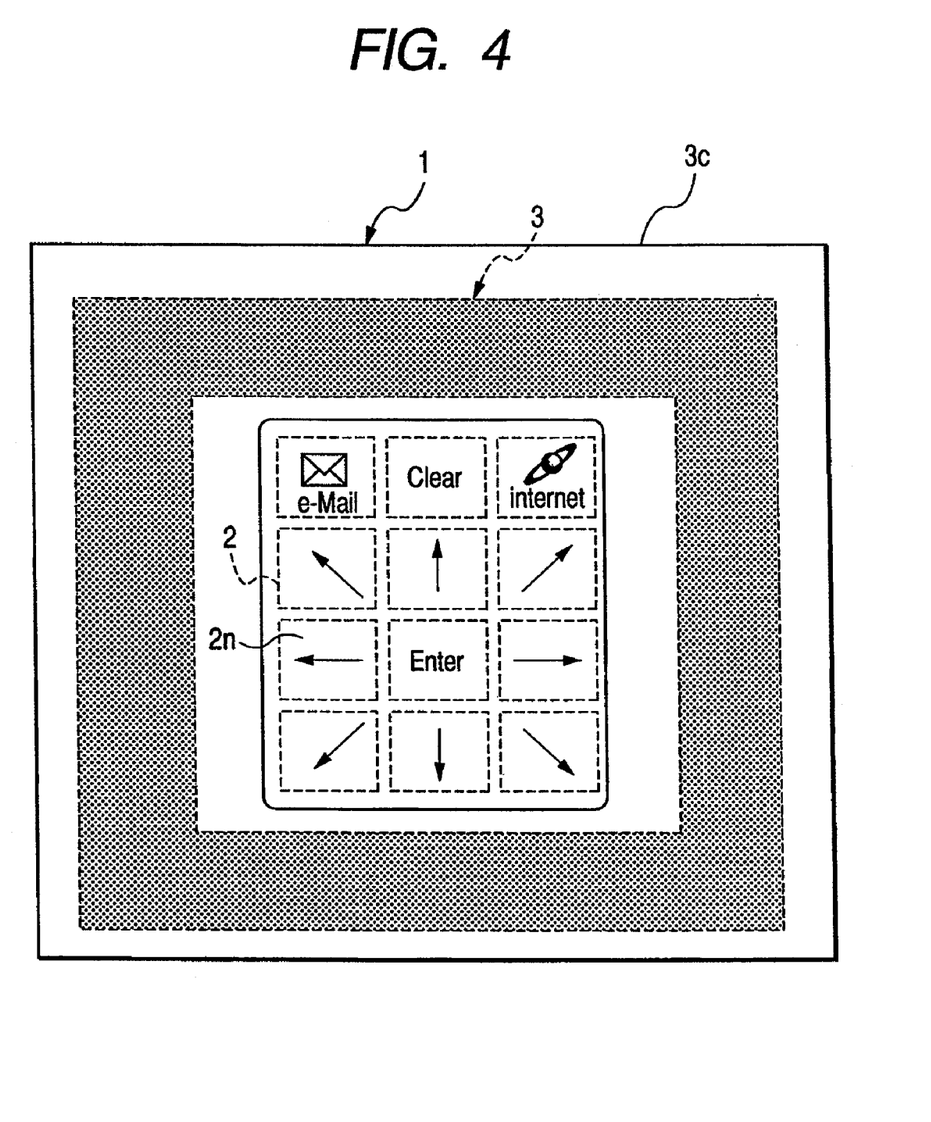
FIG. 4 is a plan view showing a noise detection electrostatic sensor according to another aspect of the present embodiment.

FIG. 1 is a plan view showing a positional relationship and a size relationship between an input electrostatic sensor and a noise detection electrostatic sensor. FIG. 2 is a cross-sectional view taken along line 2-2 of FIG. 1. FIGS. 3 and 4 show noise detection electrostatic sensors according to the other aspects of the present embodiment.

As shown in FIG. 1, the input device 1 according to the present embodiment includes a plurality of input electrostatic sensors 2 that are disposed around an input key 2n of an electronic apparatus having the input device 1 and a noise detection electrostatic sensor 3.

As shown in FIG. 1, the input electrostatic sensor 2 is provided at the backside of the input key 2n on which symbols such as numerals or arrows are drawn. As shown in FIGS. 1 and 2, the input electrostatic sensor 2 includes a dielectric substrate 2a and a flat input electrode 2b formed on the dielectric substrate 2a. In addition, the input electrostatic sensor 2 is provided such that a distance from a finger Hi of a human body contacting with the input key 2n to the input electrode 2b becomes an input distance Da (in which it is determined that the input electrostatic sensor 2 reacts and an input operation was performed.

As shown in FIG. 1, the noise detection electrostatic sensor 3 is provided at the outside of the input key 2n and the input electrostatic sensor 2. As shown in FIGS. 1 and 2, the noise detection electrostatic sensor 3 includes the dielectric substrate 2a and a flat noise detection electrode 3a formed on the dielectric substrate 2a. The noise detection electrode 3a has an area larger than that of the input electrode 2b. In addition, the shape of the noise detection electrode 3a is not limited to a single rectangle. The noise detection electrode 3a may be formed of four rectangles shown in FIG. 3 or in a shape that surrounds the input electrode 2b shown in FIG. 4. In other words, the noise detection electrode 3a is provided at the outside or the circumference (hereinafter, the outside and the circumference are referred to as "periphery") of the input electrode 2b and may have an area larger than one input electrode 2b.

In addition, the noise detection electrostatic sensor 3 is provided on the periphery of the input key 2n and the backside of a protective cover 3c provided on the periphery of the input key 2n. The protective cover 3c is made of plastic and has a thickness by which the noise detection electrostatic sensor 3 does not react when the finger Hc of the human body contacts with the protective cover 3c. In addition, the protective cover 3c may have a thickness by which the noise detection electrostatic sensor 3 reacts as small as the control means 9 cannot determine a noise component.

Figure 5:
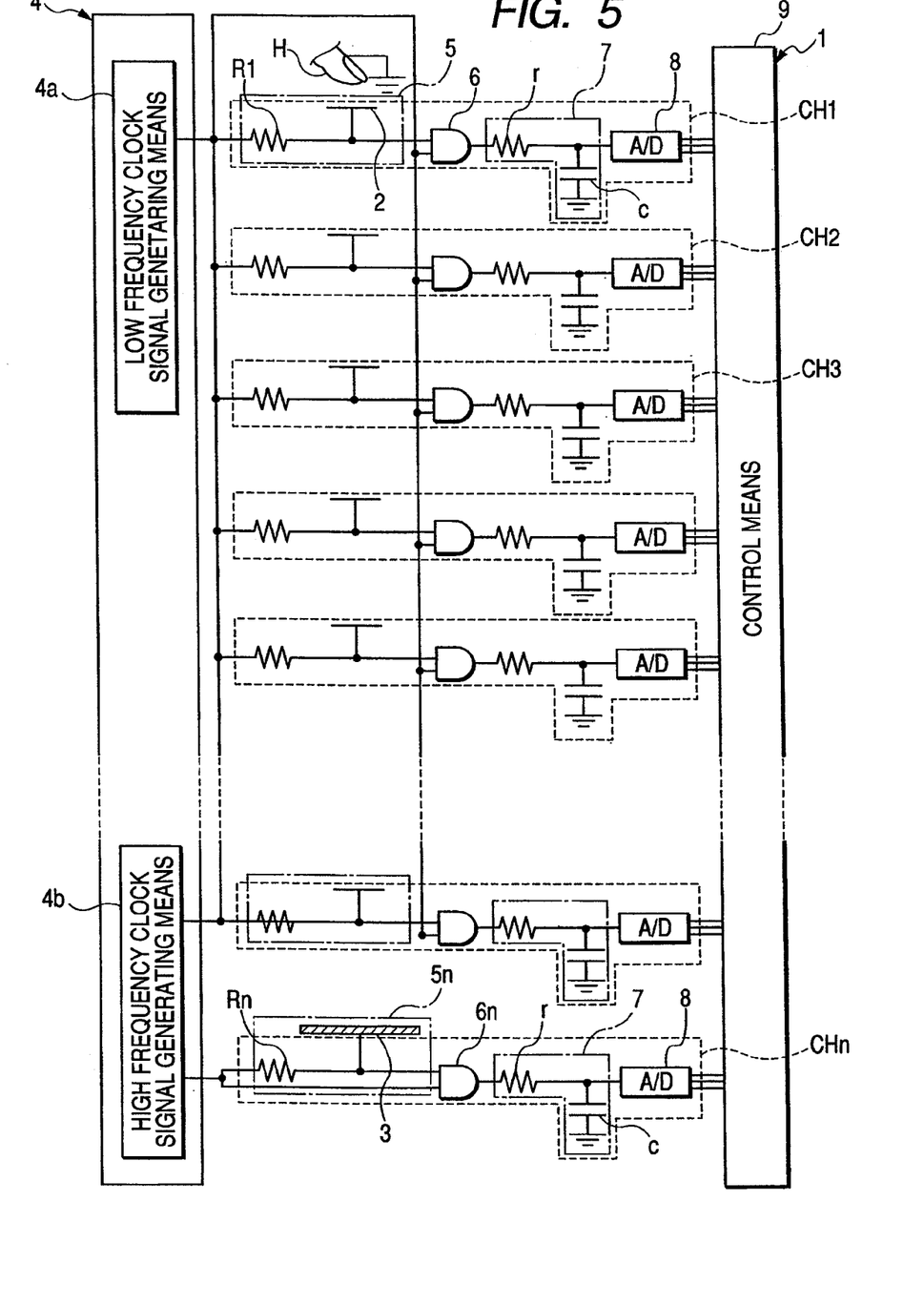
FIG. 5 is a block diagram showing a circuit of the input device according to the present embodiment.
Figure 6A:
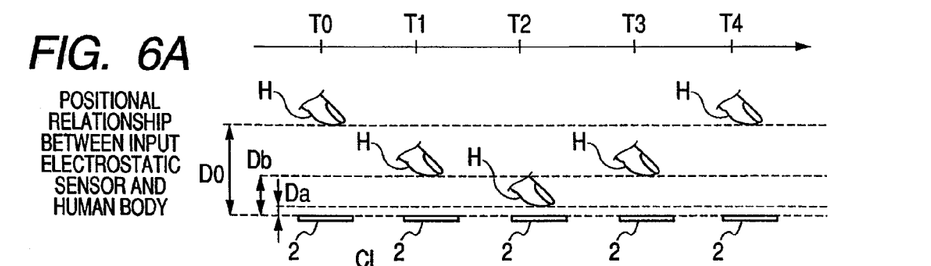
FIG. 6 is a graph showing a detection operation of the input electrostatic sensor according to the present embodiment from a left side to a right side in time series.
Figure 6B:
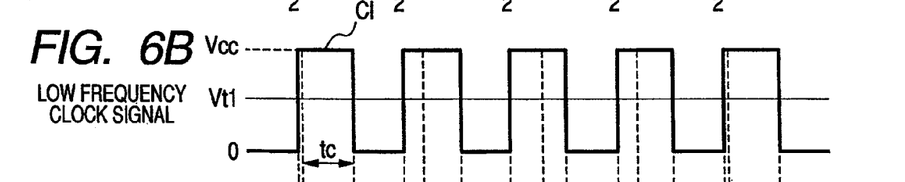
Figure 6C:
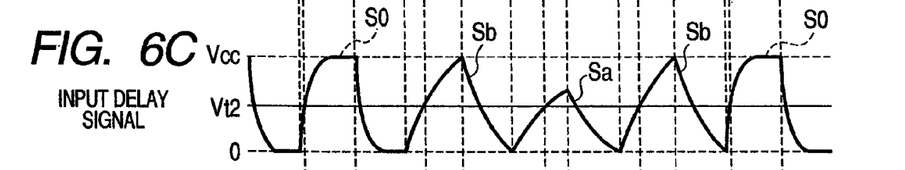
Figure 6D:
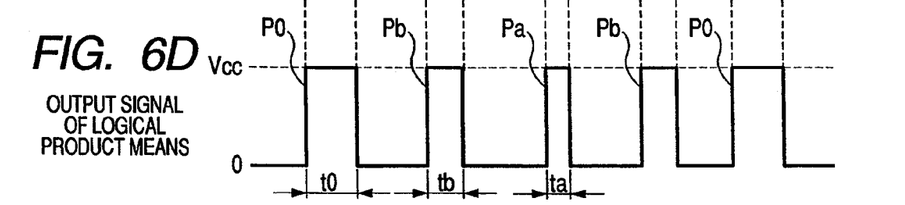
Figure 6E:
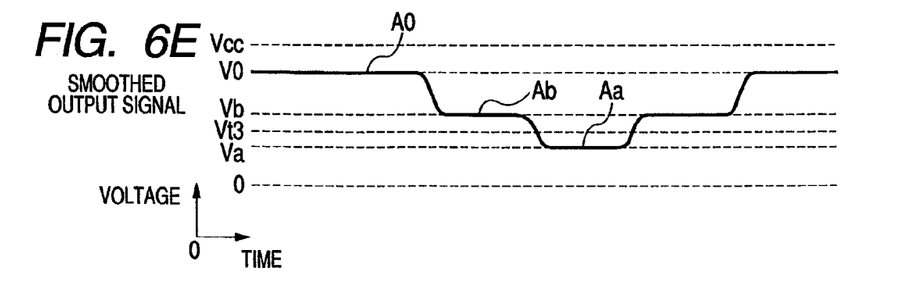
Figure 7A:
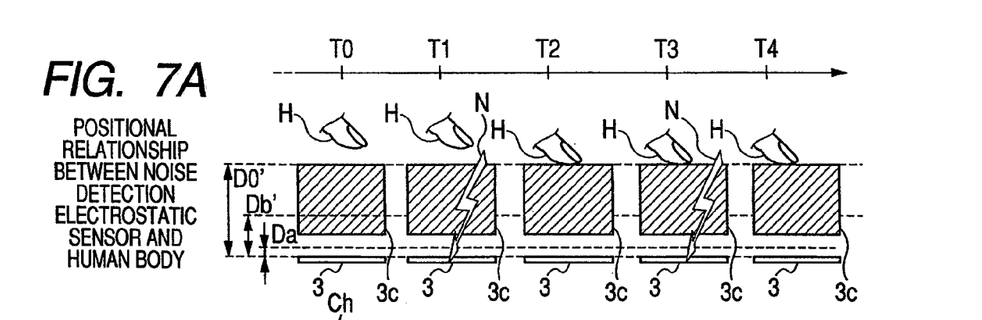
FIG. 7 is a graph showing a detection operation of the noise detection electrostatic sensor according to the present embodiment from a left side to a right side in time series.
Figure 7B:
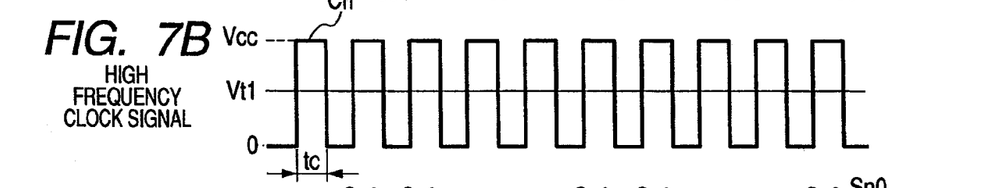
Figure 7C:
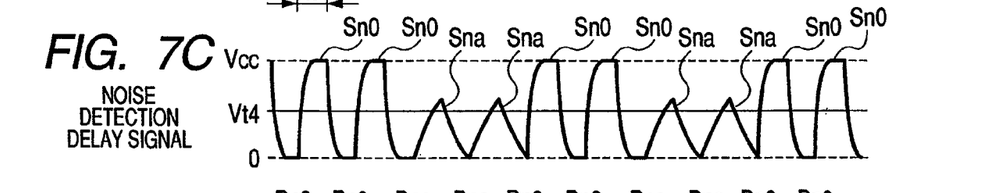
Figure 7D:
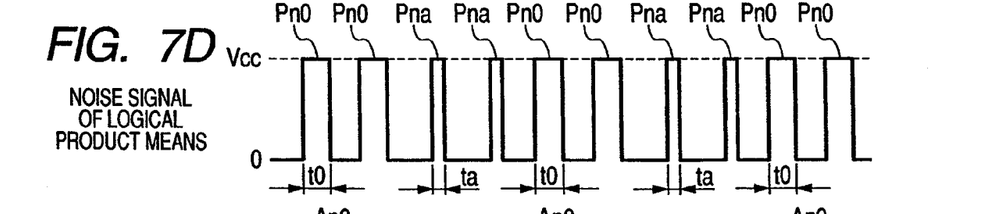
Figure 7E:
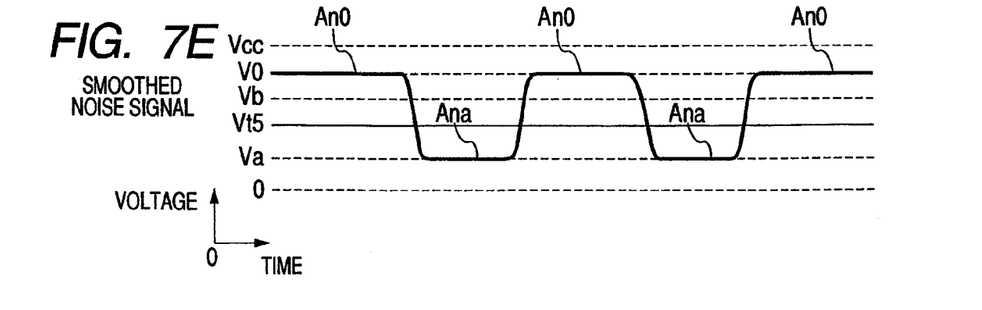

FIG. 5 shows a circuit of the input device 1 having the input electrostatic sensor 2 and the noise detection electrostatic sensor 3.

In the input device 1 according to the present embodiment, a clock signal generating means 4, delay means 5 and 5n, a logical product means 6 and 6n, a smoothing means 7, an A/D converting means 8, and a control means 9 are formed in the respective channels having the input electrostatic sensor 2 and the noise detection electrostatic sensor 3.

The clock signal generating means 4 includes a low frequency clock signal generating means 4a for generating a low frequency clock signal Cl and a high frequency clock signal generating means 4b for generating a high frequency clock signal Ch. The low frequency clock signal generating means 4a is connected to the input delay means 5 having the input electrostatic sensor 2 and the logical product means 6 in each channel connected to the input delay means 5.

The input delay means 5 has a resistor R and the input electrostatic sensor 2. The input delay means 5 generates an input delay signal obtained by applying delay according to change in capacitance of the input electrostatic sensor 2 to the low frequency clock signal Cl, and is connected to the logical product means 6 in the same channel.

The logical product means 6 connected to the input delay means 5 includes a AND circuit. The logical product means 6 outputs an output signal that is obtained from the low frequency clock signal Cl and the input delay signal based on a preset threshold value.

The smoothing means 7 includes a capacitor c of which one end is grounded and the other is connected to a resistor R, smoothes the output signal obtained from the logical product means 6 and transmits the output signal to the A/D converting means 8.

The A/D converting means 8 includes an A/D converter. The A/D converting means 8 converts the output signal output from the smoothing means 7 into a digital signal and transmits the digital signal to the control means 9.

The high frequency clock signal generating means 4b included in the clock signal generating means 4 is connected to a noise detection delay means 5n having a noise detection electrostatic sensor 3 and a logical product means 6n connected to the noise detection delay means 5n.

Then noise detection delay means 5n includes a resistor Rn and the noise detection electrostatic sensor 3. The noise detection delay means 5n generates a noise detection delay signal obtained by applying delay according to change in capacitance of the noise detection electrostatic sensor 3 to the high frequency clock signal Ch, and is connected to the logical product means 6n in the same channel.

The logical product means 6n connected to the noise detection delay means 5n includes a AND circuit. The logical product means 6n outputs an output signal that is obtained from the high frequency clock signal Ch and the input delay signal based on preset threshold values Vt1 and Vt4.

The smoothing means 7 and the A/D converting means 8 in the channel having the noise detection electrostatic sensor 3 is the same as the smoothing means 7 and the A/D converting means 8 in each channel having the input electrostatic sensor 2.

The control means 9 includes a central processing unit (CPU). The control means 9 receives the output signal obtained by the input electrostatic sensor 2 and the noise signal obtained by the noise detection electrostatic sensor 3 and compares the output signal and the noise signal, both of which are converted into the digital signals, to each other and controls an input operation.

Figure 8A:
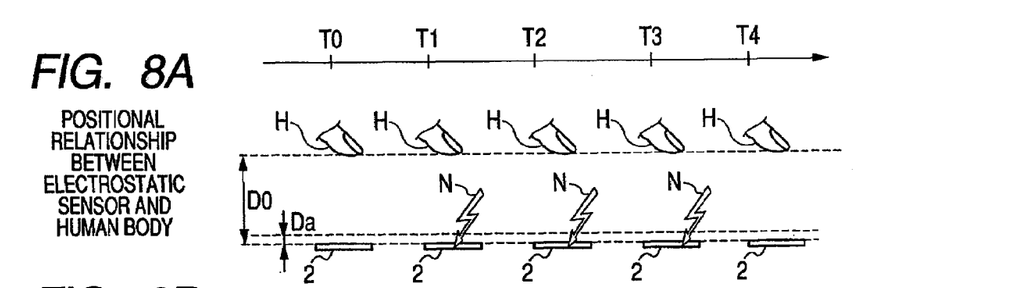
FIG. 8 is a graph showing detection operations from a left side to a right side in time series when the input electrostatic sensor and the noise detection electrostatic sensor according to the present embodiment react with noise having a strong electric field.
Figure 8B:
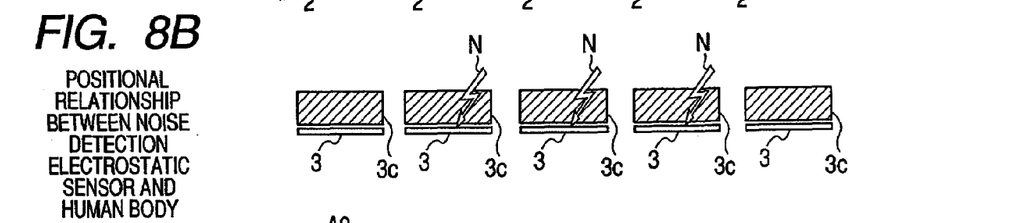
Figure 8C:
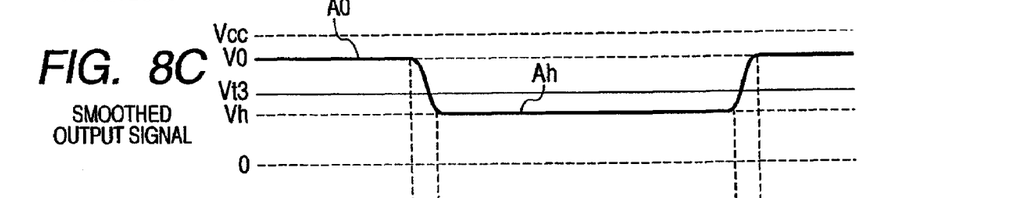
Figure 8D:
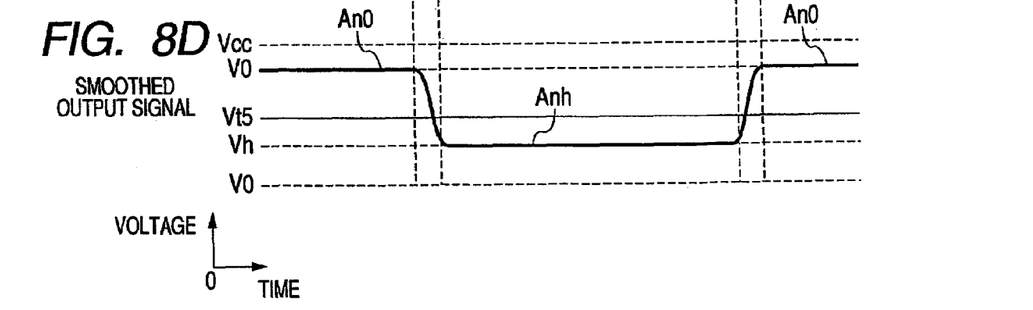
Figure 9A:
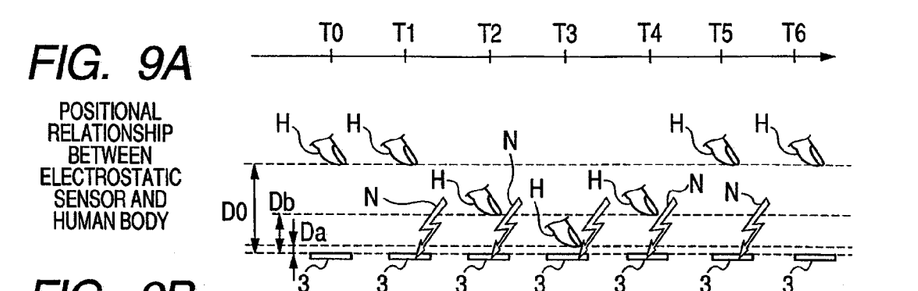
FIG. 9 is a graph showing detection operations from a left side to a right side in time series when the input electrostatic sensor and the noise detection electrostatic sensor according to the present embodiment react with noise having a weak electric field.
Figures 9B, 9C:
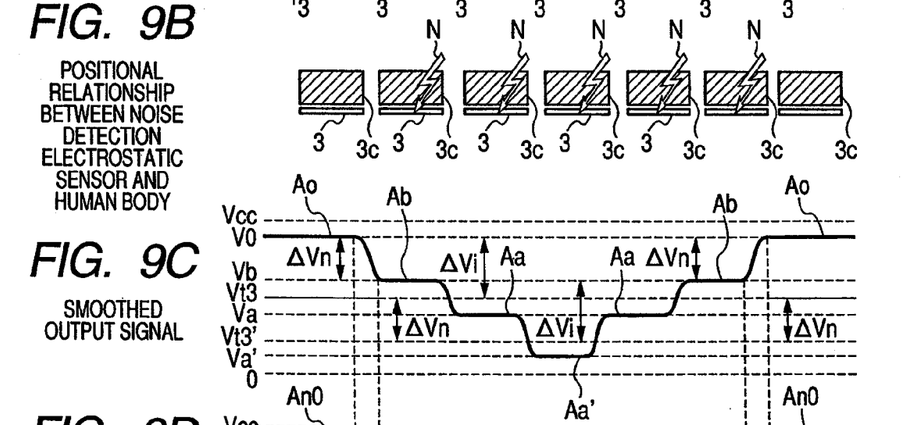
Figure 9D:
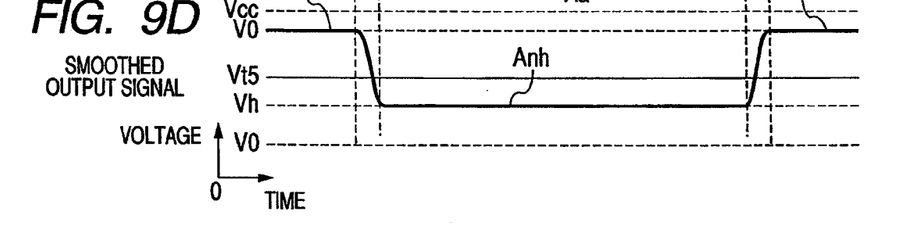

Next, an operation of the input device 1 according to the present embodiment will be described with reference to FIGS. 6 to 9. FIG. 6 shows a detection operation of the input electrostatic sensor 2 from a left side to a right side in time series. FIG. 7 shows a detection operation of the noise detection electrostatic sensor 3 from a left side to a right side in time series. FIG. 8 shows detection operations from a left side to a right side in time series when the input electrostatic sensor 2 and the noise detection electrostatic sensor 3 react with noise having a strong electric field. FIG. 9 shows detection operations from a left side to a right side in time series when the input electrostatic sensor 2 and the noise detection electrostatic sensor 3 react with noise having a weak electric field.

As shown in FIG. 6, the input device 1 according to the present embodiment, similar to the detection operation of the conventional electrostatic sensor, when a finger H of a human body approaches or makes contact with the input electrostatic sensor 2 up to an input distance Da, the voltage of the smoothed output signal drops to a voltage Va lower than a threshold value Vt3. Accordingly, the control means 9 detects that the input operation of the input electrostatic sensor 2 was performed and controls the input operation according to the detection result.

In addition, since the input device 1 according to the present embodiment has the noise detection electrostatic sensor 3, it is possible to actively detect noise N. For example, as shown in FIG. 7, in a case where the finger H of the human body is separated from the noise detection electrostatic sensor 3 by at least a non-reaction distance Do' (which the noise detection electrostatic sensor 3 does not react by the finger H of the human body) (T0 and T1), when the noise detection electrostatic sensor 3 detects the noise N (T1), the high frequency clock signal Ch is changed to a delay signal Sna of which the wavelength slowly rises and the delay signal Sna is output from the noise detection delay means 5n. Furthermore, the noise detection logical product means 6n receives the high frequency clock signal Ch and the noise detection delay signal and outputs a noise signal Pna. The noise signal is smoothed by the smoothing means 7 to become a smoothed noise signal Ana which drops from a voltage V0 to a voltage Va. Since the voltage Va of the smoothed noise signal Ana is lower than a threshold value Vt5 for determining whether the noise N is input or not, the control means 9, which receives the noise signal, can detect that the noise detection electrostatic sensor 3 and the input electrostatic sensor 2 adjacent to the noise detection electrostatic sensor 3 detect the noise N.

In addition, as shown in FIG. 7, since the noise detection electrostatic sensor 3 includes a protective cover 3c having a thickness by which the noise detection electrostatic sensor 3 does not reacts, although the finger H of the human body contacts with the protective cover 3c (T2), a smoothed noise signal An0 does not cause a voltage drop. Accordingly, the control means 9 can accurately determine whether the change in capacitance of the noise detection electrostatic sensor 3 is generated by the finger H of the human body or a cause (noise N) different from the finger H of the human body. When the noise N is spread in the vicinity of the noise detection electrostatic sensor 3 while the finger H of the human body contacts with the protective cover 3c (T3), the noise N escapes from the protective cover 3c to change the capacitance of the noise detection electrostatic sensor 3. Thus, a smoothed output signal Ana, which is the same as that when the finger H of the human body does not contact with the protective cover 3c (T1), is output to the control means 9. In other words, the input device 1 according to the present embodiment can separately detect only the cause (noise N) different from the approach or the contact of the finger H of the human body by the noise detection electrostatic sensor 3.

A detection surface (noise detection electrode 3a) of the noise detection electrostatic sensor 3 is larger than a detection surface (input electrode 2b) of the input electrostatic sensor 2. To this end, in the capacitance C =dielectric constant e×(area S/distance between electrodes D), the capacitance of the noise detection electrostatic sensor 3 is larger than the capacitance of the input electrostatic sensor 2. When the same clock signal is input to the input delay means 5 and the noise detection delay means 5n, in a time constant t=resistor R×capacitance C, since it is possible to output an output voltage (noise detection delay signal) in which the input voltage wavelength of the noise detection delay means 5n rises slower than the output voltage wavelength (input delay signal) of the input delay means 5, the smoothed noise signal may cause a voltage drop larger than the smoothed output signal. Accordingly, the control means 9 can sensitively detect the noise N spread in the vicinity of the noise detection electrostatic sensor 3.

The frequency of the clock signal (high frequency clock signal Ch) input to the noise detection electrostatic sensor 3 is higher than that of the clock signal (low frequency clock signal Cl) input to the input electrostatic sensor 2. Accordingly, when the area of the electrode of the input electrostatic sensor 2 and the area of the electrode of the noise detection electrostatic sensor 3 are equal to each other and the electrode of the input electrostatic sensor 2 and the noise detection electrostatic sensor 3 detect the same noise N, the wavelength of the noise detection delay signal (for example, the delay signal Sna) is smaller than that of the input delay signal, and thus the voltage drop of the smoothed noise signal becomes larger than that of the smoothed output signal. Accordingly, the noise detection electrostatic sensor 3 can sensitively detect the noise N.

Subsequently, the control means 9, which receives the output signal and the noise signal, compares the output signal with the noise signal. For example, as shown in FIG. 8, in a state that the finger H of the human body is separated from the input electrostatic sensor 2 by the non-reaction distance D0 (T0 to T4), when the capacitances of the input electrostatic sensor 2 and the noise detection electrostatic sensor 3 are changed by the noise N having the strong electric field (T1 to T3), as shown in FIGS. 8C and 8D, the smoothed output signal Ah and the smoothed noise signal Anh drop lower than threshold values Vt3 and Vt5. When the smoothed output signal drops lower than the threshold value Vt3, the general means 9 generally determines that the input operation was performed and controls the input operation. However, when the noise N is detected by the noise detection electrostatic sensor 3 (T1 to T3), the noise signal also drops lower than the threshold value Vt5 together with the smoothed output signal and thus the control means 9 determines that the input operation was not performed and controls the input operation. Accordingly, the input device 1 according to the present embodiment can determine that the noise N is included in the output signal to control the input operation, although the output signal becomes lower than the threshold value Vt3 by the noise N.

In addition, the input device 1 according to the present embodiment can change the threshold value Vt3 of the output signal according to the voltage drop due to the noise component, it is possible to make the sensitivity of the input electrostatic sensor 2 uniform. For example, as shown in FIG. 9, when the noise having the weak electric field is included in the noise N (T1), the smoothed output signal Ab causes a voltage drop by $\Delta Vn(\Delta Vn=V0-Vb)$. Furthermore, when the smoothed output signal drops by $\Delta Vn$ (T1), the smoothed noise signal $\Delta nh$ also causes a voltage drop. Accordingly, the control means 9 determines that the voltage drop $\Delta Vn$ is caused by the noise component.

When the control means 9 determines that the voltage drop $\Delta Vn$ is caused by the noise component, the threshold value Vt3 of the output signal becomes a corrected threshold value Vt3' which drops by the voltage drop $\Delta Vn$ (T1). By this change, since the voltage drop $\Delta Vi(\Delta Vi=V0-vt3)$ necessary for detecting the approach or the contact of the finger H of the human body is ensured even after the change ($\Delta Vi=V0-Vt3=Vb-Vt3'$), although the voltage signal smoothed by the noise N and the finger H of the human body which approaches the input electrostatic sensor 2 up to the reaction distance Db drops from a voltage Vb to a voltage Va lower than the threshold value Vt3 (T2), the control means 9 determines that the input operation was not performed and controls the input operation. In addition, when the voltage of the output signal smoothed by the noise N and the finger H of the human body which approaches the input electrostatic sensor 2 up to the input distance Da drops from the voltage Va to a voltage Va' lower than the corrected threshold value Vt3' (T3), the control means 9 determines that the input operation was performed and controls the input operation. In other words, even when the noise N is continuously included in the smoothed output signal (T1 to T5), it is possible to make the sensitivity of the input electrostatic sensor 2 uniform.

According to the input device 1 of the present embodiment, since the noise detection electrostatic sensor 3, which is separately provided, physically and accurately detects only the noise component and the control means 9, which receives the noise signal, controls the input operation according to the noise component, it is possible to significantly reduce malfunction of the input device, which is generated by the noise component.

In addition, the control means 9 according to the present embodiment can detect the noise component only using the detection result obtained from the input electrostatic sensor 2. For example, it is determined whether the output signal transmitted to the control means 9 is obtained from the cause different from the approach or the contact of a portion of the human body, depending on whether the step number of the output signal obtained by a predetermined sampling time is a predetermined step number. When the predetermined sampling time is not set, it is determined depending on whether a predetermined time elapses after the output signal is obtained from the input electrostatic sensor 2. Accordingly, although the noise N having the same strong electric field as that upon the approach or the contact of the portion of the human body is accidentally included in the output signal, the control means 9 can determine whether the noise component is included in the output signal.

In addition, the present invention is not limited to the above-described embodiments and may be variously changed as needed.

What is claimed is:

1. An input device comprising:
    an input electrostatic sensor having an input electrode to detect a change in capacitance caused by an approach or contact of a portion of a human body to the input electrode;
    a noise detection electrostatic sensor having a noise detection electrode disposed on a periphery of the input electrostatic sensor to detect a change in capacitance caused by an external noise other than the approach or contact of the portion of a human body; and
    a control unit to receive an output signal from the input electrostatic sensor and a noise output signal from the noise detection electrostatic sensor and to compares the output signal with the noise output signal to detect a noise component,
    wherein the control unit discriminates the output signal and the noise output signal and controls an input operation based on the output signal.

2. The input device according to claim 1, wherein the noise detection electrostatic sensor has a detection surface larger than that of the input electrostatic sensor.

3. The input device according to claim 1,
    wherein the noise detection electrostatic sensor has a protective cover that is disposed between the portion of the human body approaching the noise detection electrostatic sensor, and
    wherein the protective cover has a thickness that the noise detection electrostatic sensor does not react to when the portion of the human body makes contact with the protective cover and a thickness that the noise detection electrostatic sensor reacts to when the control unit cannot determine the noise component.

4. The input device according to claim 1, comprising:
    a low frequency clock signal generator that generates a low frequency clock signal;
    an input delay generator that generates an input delay signal obtained by applying delay according to the change in capacitance of the input electrostatic sensor to the low frequency clock signal;

a high frequency signal generator that generates a high frequency clock signal;

a noise detection delay generator that generates a noise detection delay signal obtained by applying delay according to change in capacitance of the noise detection electrostatic sensor to the high frequency clock signal;

a logical product receiver that receives the low frequency clock signal, the input delay signal, the high frequency clock signal, and the noise detection delay signal and outputs the output signal or the noise signal;

a smoothing unit that smoothes the output signal or the noise signal; and an A/D convertor that converts the output signal and the noise signal output from the smoothing means into respective digital signal;

wherein the control unit, compares the output signal with the noise signal, both of which are converted into the respectively digital signals and determines the noise component.

5. The input device according to claim 1, wherein the control unit changes a threshold value that determines whether the portion of the human body approaches or makes contact in correspondence with the noise component included in the output signal obtained by comparing the output signal with the noise signal.

6. The input device according to claim 1, wherein the control unit determines whether the output signal transmitted to the control means is obtained from a noise different from the approach or the contact of the portion of the human.

7. The input device according to claim 6, wherein the determination whether the output signal transmitted to the control unit is obtained from a noise different from the approach or the contact of the portion of the human depends on whether a predetermined time lapses after the output signal is received or a step number obtained from the output signal is a predetermined step number.

8. An input device comprising:

an input electrostatic sensor having an input electrode to detect a change in capacitance caused by the approach or contact of a portion of a human body to the input electrode;

a noise detection electrostatic sensor having a noise detection electrode to detect a change in capacitance caused by an external noise other than the approach or contact of a portion of a human body;

a control unit to compare an output signal obtained from the input electrostatic sensor with a noise signal obtained from the noise detection electrostatic sensor, determines the output signal obtained from the cause different from the approach or the contact of the potion of the human body to a noise component, and controls an input operation a low frequency clock signal generating means that generates a low frequency clock signal;

an input delay generator to generate an input delay signal obtained by applying delay according to the change in capacitance of the input electrostatic sensor to the low frequency clock signal;

a high frequency signal generator to generate a high frequency clock signal;

a noise detection delay generator to generate a noise detection delay signal obtained by applying delay according to change in capacitance of the noise detection electrostatic sensor to the high frequency clock signal;

a logical product receiver to receive the low frequency clock signal, the input delay signal, the high frequency clock signal, and the noise detection delay signal and to output the output signal or the noise signal;

a smoothing unit that smoothes the output signal or the noise signal; and an A/D converter to convert the output signal and the noise signal output from the smoothing unit into respective digital signal;

wherein the control unit compares the output signal with the noise signal, both of which are converted into the respectively digital signals, and determines the noise component.

9. The input device according to claim 8, wherein the input electrostatic sensor detects whether a portion of a human body approaches or makes contact by a change in capacitance.

10. The input device according to claim 8, wherein the noise detection electrostatic sensor is provided on the periphery of the input electrostatic sensor and a change in capacitance that is generated by a noise different from the approach or the contact of a portion of a human body.

11. The input device according to claim 8, wherein the noise detection electrostatic sensor has a protective cover that is disposed between the portion of the human body approaching the noise detection electrostatic sensor and the noise detection electrostatic sensor, and wherein the protective cover has a thickness that the noise detection electrostatic sensor does not react to when the portion of the human body makes contact with the protective cover and a thickness that the noise detection electrostatic sensor reacts to when the control unit cannot determine the noise component.

12. An input device comprising:

an input electrostatic sensor having an input electrode to detect a change in capacitance caused by the approach or contact of a portion of a human body to the input electrode;

a noise detection electrostatic sensor having a noise detection electrode to detect a change in capacitance caused by an external noise other than the approach or contact of the portion of a human body;

a control unit that compares an output signal obtained from the input electrostatic sensor with a noise signal obtained from the noise detection electrostatic sensor, determines the output signal obtained from the cause different from the approach or the contact of the potion of the human body to a noise component, and controls an input operation, wherein the control unit changes a threshold value that determines whether the portion of the human body approaches or makes contact in correspondence with the noise component included in the output signal obtained by comparing the output signal with the noise signal.

13. The input device according to claim 12, wherein the input electrostatic sensor detects whether a portion of a human body approaches or makes contact by a change in capacitance.

14. The input device according to claim 12, wherein the noise detection electrostatic sensor is provided on the periphery of the input electrostatic sensor and detects the change in capacitance that is generated by a noise different from the approach or the contact of the portion of the human body.

15. The input device according to claim 12, wherein the noise detection electrostatic sensor has a protective cover that is disposed between the portion of the human body approaching the noise detection electrostatic sensor and the noise detection electrostatic sensor, and
wherein the protective cover has a thickness that the noise detection electrostatic sensor does not react to when the portion of the human body makes contact with the protective cover and a thickness that the noise detection electrostatic sensor reacts to when the control unit cannot determine the noise component.

* * * * *

UNITED STATES PATENT AND TRADEMARK OFFICE
CERTIFICATE OF CORRECTION

PATENT NO. : 7,279,904 B2 Page 1 of 1
APPLICATION NO. : 11/424503
DATED : October 9, 2007
INVENTOR(S) : Kunio Sato It is certified that error appears in the above-identified patent and that said Letters Patent is hereby corrected as shown below:

<u>In the Claims</u>

Column 10, in claim 1, line 42, after "sensor and to" delete "compares" and substitute --compare-- in its place.

Column 11, in claim 4, line 19, immediately after "the control unit" delete "," (comma).

Column 12, in claim 10, line 23, after "electrostatic sensor and" and insert --detects--.

Signed and Sealed this

Twenty-ninth Day of April, 2008

JON W. DUDAS
*Director of the United States Patent and Trademark Office*